(12) United States Patent
Taniguchi et al.

(10) Patent No.: US 8,402,645 B2
(45) Date of Patent: Mar. 26, 2013

(54) METHOD FOR PRODUCING AN ELECTRIC COMPONENT-MOUNTED SUBSTRATE

(75) Inventors: Masaki Taniguchi, Tochigi (JP); Kazutaka Furuta, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 1185 days.

(21) Appl. No.: 12/239,356

(22) Filed: Sep. 26, 2008

(65) Prior Publication Data

US 2009/0090001 A1    Apr. 9, 2009

Related U.S. Application Data

(63) Continuation of application No. PCT/JP2007/056173, filed on Mar. 26, 2007.

(30) Foreign Application Priority Data

Mar. 28, 2006 (JP) .................................. 2006-088441

(51) Int. Cl.
*H05K 3/30* (2006.01)

(52) U.S. Cl. ............... 29/832; 29/846; 29/852; 174/260

(58) Field of Classification Search ............ 29/825, 29/830, 832, 846, 852; 174/260
See application file for complete search history.

(56) References Cited

U.S. PATENT DOCUMENTS

| | | | |
|---|---|---|---|
| 6,359,235 B1 * | 3/2002 | Hayashi | 174/260 |
| 6,734,542 B2 * | 5/2004 | Nakatani et al. | 257/687 |
| 6,855,892 B2 * | 2/2005 | Komatsu et al. | 174/256 |
| 7,394,663 B2 * | 7/2008 | Yamashita et al. | 361/766 |
| 2001/0042640 A1 | 11/2001 | Nakamura et al. | |

FOREIGN PATENT DOCUMENTS

| | | |
|---|---|---|
| JP | 10-074887 | 3/1998 |
| JP | 10-256311 | 9/1998 |
| JP | 11-045904 | 2/1999 |
| JP | 2000-105388 | 4/2000 |
| JP | 2002-093933 | 3/2002 |
| JP | 2002-359264 | 12/2002 |
| JP | 2003124256 | 4/2003 |
| JP | 2005-032952 | 2/2005 |
| JP | 2001-274530 | 10/2005 |
| WO | 2006027888 | 3/2006 |

OTHER PUBLICATIONS

European Search Report (PCT/JP2007056173) issued on Oct. 27, 2009.
Korean Office Action dated Jun. 30, 2010 for Korean Application No. 10-2008-7023505 (4 pages).

* cited by examiner

*Primary Examiner* — Carl Arbes
(74) *Attorney, Agent, or Firm* — K&L Gates LLP (57) ABSTRACT

A method of producing an electric component-mounted substrate having a cavity structure is provided. Because a supporting substrate and electric components and are connected together to a first face of a base substrate, the number of steps for the connection is reduced to shorten the producing time. When electric components are to be connected to a second face, the base substrate is supported by the supporting substrate, and the electric components and connected to the first face do not contact a processing table and therefore they undergo no damage. Thus, an electric component-mounted substrate having high reliability can be produced in a short time.

3 Claims, 5 Drawing Sheets

METHOD FOR PRODUCING AN ELECTRIC COMPONENT-MOUNTED SUBSTRATE

CROSS REFERENCE TO RELATED APPLICATIONS

This is a Continuation of International Application No. PCT/JP2007/056173 filed Mar. 26, 2007, which claims priority to Japan Patent Application No. 2006-088441, filed on Mar. 28, 2006. The entire disclosures of the prior applications are hereby incorporated by references herein in their entireties.

BACKGROUND

The present disclosure relates to an electric component-mounted substrate.

Since electronic component modules such as communication modules, wireless LANs and tuners are mounted on electric devices including cell phones, the modules have been heretofore required to be small and thin.

The electric component module, which usually has a few or several ICs for processing signals and the like, and dozens of passive components such as C and R and other odd-form component, is mounted on a mother board.

As to the electric component module, there are electric component-mounted substrates in which electric components are mounted on a front face and a back face of a base substrate. In an example of such substrates, a ring-shaped substrate, which surrounds the electric components, is formed on the front face or the back face of the base substrate, and the electric components are connected in a space (cavity) inside the ring.

Because it is difficult to form such a cavity structure in a process for producing a buildup substrate, the cavity structure is generally formed by connecting the ring-shaped substrate onto the front face of the base substrate. The electric components are connected to the base substrate after the cavity structure is formed.

However, because, in this method, the cavity structure is formed on the base substrate before the connection of the electric components, there is a problem that because the cavity structure hinders feeding of a connecting material such as a solder, the connecting material could not be fed by a simple method such as printing with a metal mask or bonding of an anisotropic electroconductive film. Accordingly, because the method for feeding the connecting material is limited to a method using a dispenser, the connecting material is limited to a material having excellent dischargeability from the dispenser. In addition, it is difficult to feed the connecting material in the form of fine patterns.

See, Patent Documents JP-A H11-45904, JP-A 2000-105388, JP-A 2002-93933, JP-A 2002-359264, and JP-A 2005-32952.

SUMMARY

The present disclosure is directed to solving the above mentioned problems, and is aimed at providing a technique to produce a substrate having a cavity structure by a simple method.

In an embodiment, a method for producing an electric component-mounted substrate includes connecting electric components to a first face as one side of a base substrate and a second face as a side opposite to the first face, wherein the producing method includes disposing, on the first face of the base substrate, the electric component and a supporting substrate thicker than the electric component, connecting the electric component and the supporting substrate to the base substrate by pressing the electric component and the supporting substrate together, then placing the electric component on the second face in a state that the base substrate is supported by the supporting substrate, and connecting the electric component to the second face.

In an embodiment, the supporting substrate and the electric component are pressed by pressing a pressing rubber against the supporting substrate and the electric component.

In an embodiment, the electric component and the supporting substrate are disposed to locate the supporting substrate such that a through-hole of the base substrate is electrically connected to a through-hole of the supporting substrate.

In an embodiment, a planar shape of the supporting substrate is in the form of a ring, and the electric component is arranged inside the ring of the supporting substrate.

In an embodiment, and the electric component and the supporting substrate are connected to the base substrate by a connecting material such as an anisotropic electroconductive adhesive, an anisotropic electroconductive film, a paste-like electroconductive material, a low melting point metal (a solder) or the like.

Before the electric component is connected to the first face, the supporting substrate is not connected to the first face, either, so that there is nothing to hinder the disposition of the connecting material. Therefore, the method for disposing the connecting material is not limited to the method using the disposer.

According to an embodiment, because the electric components and the supporting substrate can be connected at a time and the number of the connecting steps is smaller than in the prior art references, the time for producing the electric component-mounted substrate is shortened. Further, if heating is necessary in a step or steps for connecting the electric component and the supporting substrate, reduction in the number of the connecting steps decreases the number of heatings of the base substrate and the electric components, so that damages caused by heating are lessened. When the electric component is connected to the face opposite to the supporting substrate, the supporting substrate contacts a processing table, the electric component connected to the same face on which the supporting substrate is present does not contact the processing table. Consequently, the electric component is free from damage without a special backup jig. When the pressing rubber is deformed, the flow of the pressing rubber is dammed up by the supporting substrate. Thus, the electric component is not positionally misaligned, so that the electric component-mounted substrate having high reliability can be obtained.

Additional features and advantages are described herein, and will be apparent from the following Detailed Description and the figures.

DETAILED DESCRIPTION

Figure 4A:
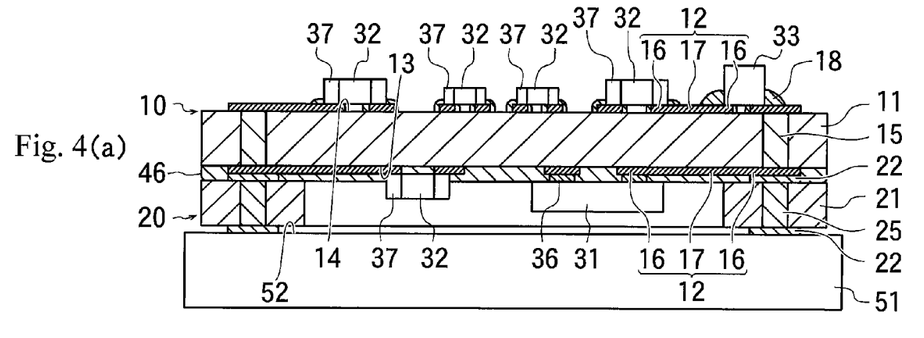
FIGS. 4(a) and 4(b) are sectional views for illustrating steps of producing an electric component-mounted substrate.
Figure 4B:
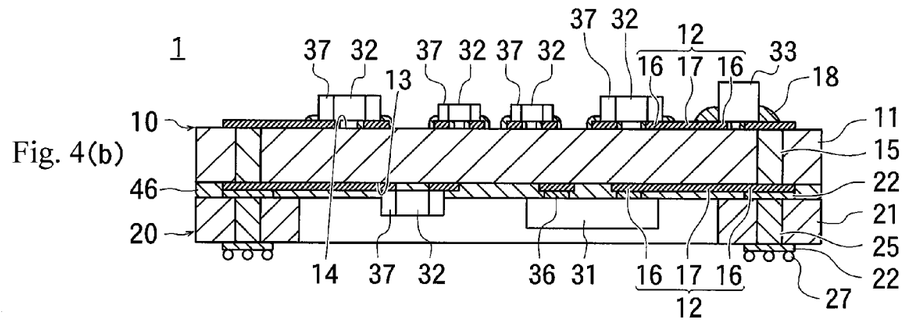

In FIG. 4(b), a reference numeral 1 shows an embodiment of an electric component-mounted substrate produced by a producing method. The electric component-mounting substrate 1 has a base substrate 10 and a supporting substrate 20.

The base substrate 10 has a substrate body 11, and wiring films 12, which are formed by patterning and disposed on a front face and a back face of the substrate body 11.

The wiring film 12 has connecting portions 16 formed wide by patterning and wiring portions 17 formed long and thin by patterning, and the connecting portions 16 are connected to each other by the wiring portions 17.

Electric components 32 and in this embodiment, an odd-form component 33, are disposed on the front face of the substrate body 11, while an electric component 31 and an electric component 32 being thinner than the electric component 31 are disposed on the back face of the substrate body 11.

The electric components 31 to 33 have connection terminals 36 and 37, and the electric components 32 on the front face of the substrate body 11 are fixed with a solidified solder 18 with the connection terminals 37 contacting with the connecting portions 16. The odd-form component 33 is also fixed onto the connecting portions 16 with the solidified solder.

The electric components 31 and 32 on the back face of the substrate body 11 are fixed with a cured adhesive layer 46 in the state that the connecting terminals 36 and 37 are connected to the connecting portions 16 directly or via electro-conductive particles mentioned later. Therefore, while the electric components 31 to 33 are electrically connected to the wiring film 12, they are also mechanically connected to the base substrate 10.

In the substrate body 11 are provided through-holes 15 which penetrate it from the front face to the back face, and electric conductors that are not shown in the Figures are formed inside the through-holes 15. The connecting portions 16 are connected to both ends of the through-holes 15 respectively, so that the wiring film 12 on the front face and the wiring film 12 on the back face of the substrate body 11 are electrically connected via the electric conductors in the through-holes 15. As mentioned above, because the electric components 31 to 33 are connected to the wiring films 12, the electric components 31 to 33 are also electrically connected to the through-holes 15.

The supporting substrate 20 has a substrate body 21, through-holes 25 penetrating the substrate body 21 from the front face to the back face, and wiring films (lands) 22 formed at one and the other ends of the through-holes 25.

The planar shape of the supporting substrate 20 is in the form of a ring, and the size of the inner periphery of the ring is set to be smaller than the planar shape of the substrate body 11. Thus, the supporting substrate 20 is fixed on the back face of the substrate body 11 with the cured adhesive layer 46 such that at least one electric component 31, 32 is surrounded by the inner periphery of the ring.

The land 22 is located immediately above the through-hole 25, and the connecting portion 16 immediately above the through-hole 15 of the base substrate 10 is connected to the land 22. Therefore, the through-hole 15 of the base substrate 10 and the through-hole 25 of the supporting substrate 20 are connected to each other, such that they are aligned along a straight line.

However, the through-holes 15 and 25 are not limited to the case where they are aligned linearly, but it may be a case where the through-hole 15 of the base substrate 10 is not located immediately above the through-hole 25 of the supporting substrate 20, but they are located away from each other.

As mentioned above, because the electric components 31 and 32 connected to the base substrate 10 are connected to the through-holes 15 of the base substrate 10, the electric components 31 and 32 are connected to the through-holes 25 of the supporting substrate 20.

In this embodiment, solder balls 27 are disposed on the land 22 which is positioned on a side of the supporting substrate 20 opposite to the base substrate 10 so that the solder balls may connect the through-hole 25 to another wiring board or electric device.

When the face on the side of the base substrate 10 on which the supporting substrate 20 is connected is taken as a first face 13 and the face on the side opposite to the first face 13 is taken as a second face 14, the supporting substrate 20 is made thicker than the electric components 31 and 32 disposed on the first face 13.

Therefore, the supporting substrate 20 is projected from the first face 13 higher than the electric components 31 and 32, so that when this electric component-mounted substrate 1 is to be connected to another wiring board, it is possible that the lands 22 of the supporting substrate 20 are connected to terminals of the wiring board, and the wiring board and the electric component-mounted substrate 1 are connected electrically.

Figure 1A:
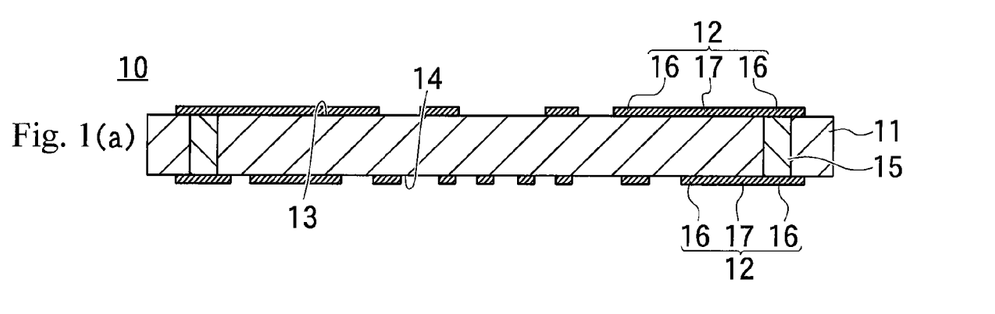
FIG. 1(a) is a sectional view of a base substrate.

Next, steps for producing the above-mentioned electric component-mounted substrate 1 will be explained. FIG. 1(a) shows the base substrate 10 before the electric components 31 and 32 and the supporting substrate 20 are connected. In this embodiment, the base substrate 10 is a rigid substrate.

Figure 2A:
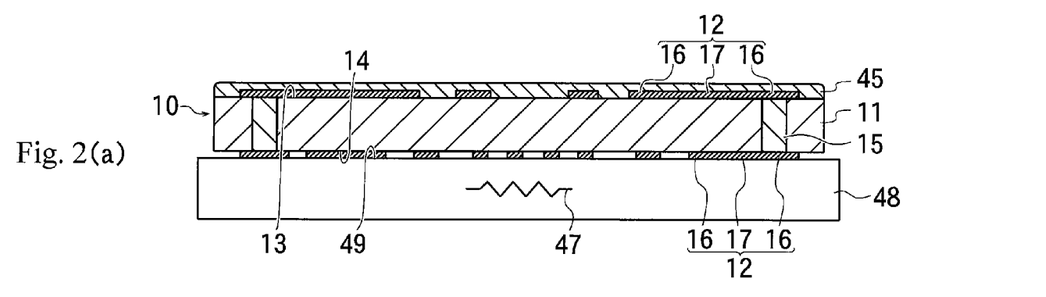
FIGS. 2(a) to 2(c) are sectional views illustrating steps of producing an electric component-mounted substrate.

The adhesive layer 45 is disposed on the connecting portions 16 of the first face 13, and the first face 13 is set in a flush plane free from unevenness when the base substrate 10 is placed on a mounting table 48 and the wiring film 12 of the second face 14 is closely contacted with a flat mounting face 49 of the mounting table 48 (FIG. 2(a)).

Figure 1B:
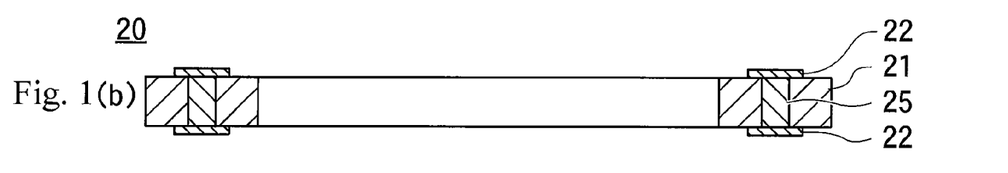
FIG. 1(b) is a sectional view of a supporting substrate.
Figure 1C:
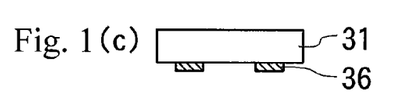
FIG. 1(c) is a sectional view of an electric component.
Figure 1D:
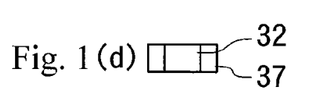
FIG. 1(d) is a side view of an electric component.

FIGS. 1(b) to 1(d) show the supporting substrate 20 and the electric components 31 and 32, respectively, before they are connected to the base substrate 10. In this embodiment, the supporting substrate 20 is a rigid substrate.

Positions of the base substrate 10 to which the electric components 31 and 32 are connected are preliminarily determined for the electric components 31 and 32, respectively. When the thicker electric component 31 and the thinner electric component 32 are disposed on the first face 13 at the predetermined positions, respectively, the connecting terminals 36 of the thicker electric component 31 and terminals 37 of the thinner electric component 32 are placed on the determined connecting portions 16 via the adhesive layer 45.

The relative position between the supporting substrate 20 and the base substrate 10 is preliminarily determined. The supporting substrate 20 thicker than the electric components 31 and 32 is positionally aligned with the base substrate 10 so that alignment marks, that are not shown in Figures, may overlap each other. After that, the supporting substrate 20 is placed on the first face 13. Then the lands 22 of the supporting substrate 20 are put on the predetermined connecting portions 16 via the adhesive layer 45 (FIG. 2(b)).

Figure 2B:
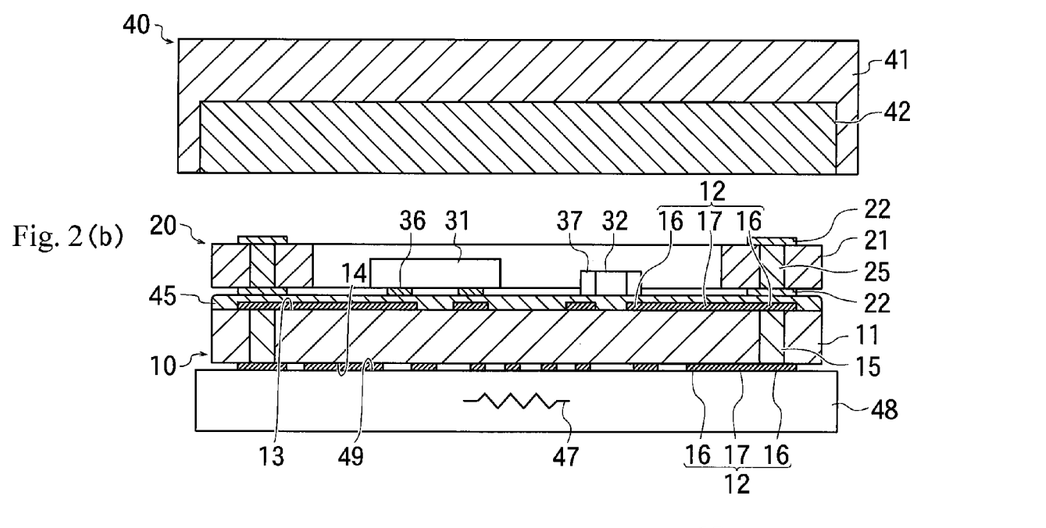

As mentioned above, because the supporting substrate 20 is thicker than the electric components 31 and 32 on the first face 13, the front edge of the supporting substrate 20 is projected from the first face 13 higher than the front ends of the electric components 31 and 32 in the state that the supporting substrate 20 and the electric components 31 and 32 are placed on the first face 13.

Figure 2C:
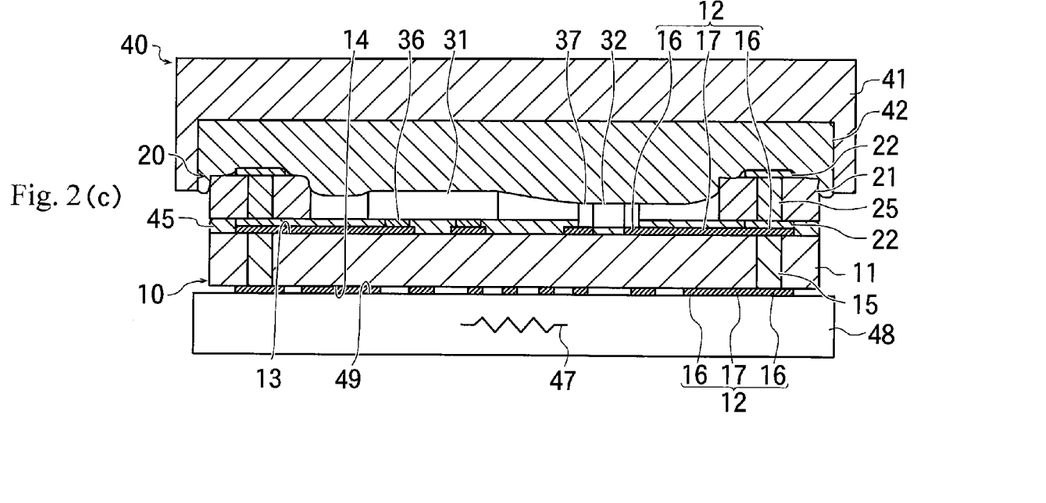

A reference numeral 40 of FIG. 2(c) denotes a pressing head in which a pressing rubber 42 is attached to a metallic pressing plate 41.

The pressing rubber 42 is made of an elastic material such as an elastomer. When the pressing head 40 is descended, the pressing rubber 42 first contacts the front edge of the supporting substrate 20. When the pressing head is further descended, the pressing rubber 42 is pressed against the supporting substrate 20. Even if a lateral force is applied to the pressing rubber 42, a portion of the pressing rubber 42 pressed against the supporting substrate 20 does not move but becomes a stationary condition relative to the supporting substrate 20.

As mentioned above, because the electric components 31 and 32 differ in thickness, the heights from the first face 13 to the leading ends of the electric components 31 and 32 differ.

As the pressing head 40 is further descended, the pressing rubber 42 is contacted with the thickest electric component 31 and next with the thinner electric component 32, and the electric components 31 and 32 are pressed with the pressing rubber 42.

At this time, the pressing rubber 42 is depressed with the electric components 31 and 32, whereas the other portion is swelled accordingly to move into a gap between the electric components 31 and 32 and a gap between the electric components 31, 32 and the supporting substrate 20. However, because the portion of the pressing rubber 42 closely contacted with the supporting substrate 20 does not move, the pressing rubber 42 does not flow outwardly beyond the supporting substrate 20 from the interior of the ring, even if a force acts outwardly from the center of the ring, following the swelling of the pressing rubber 42. Thus, a lateral force is not applied to the electric components 31 and 32. When the electric components 31 and 32 are pressed with the pressing rubber 42, the pressing rubber 42 flows outside if no supporting substrate 20 is provided around the electric components 31 and 32. So, the outwardly moving force would act upon the electric components 31 and 32, and cause the positional misalignment.

In this embodiment, because the electric components 31 and 32 are positioned inside the ring of the supporting substrate 20, no lateral force is apparently applied to the electric components 31 and 32. Accordingly, when the electric components 31 and 32 and the supporting substrate 20 are pressed together by the pressing rubber 42, the electric component 31 or 32 is not laterally displaced, and no positional misalignment of the electric components 31 and 32 occurs.

The adhesive layer 45 is composed of an anisotropic electroconductive adhesive in which electroconductive particles are dispersed in a binder. When the supporting substrate 20 and the electric components 31 and 32 are pressed, the adhesive layer 45 is pushed away by pressing. Thereby, the connecting terminals 36 and 37 of the electric components 31 and 32 and the lands 22 of the supporting substrate 20 are brought into contact with the connecting portions 16 directly or via the electroconductive particles, so that the supporting substrate 20 and the electric components 31 and 32 are electrically connected to the base substrate 10.

In this embodiment, the mounting table 48 is provided with a heater 47, which preliminarily heats the mounting table 48, and heats the adhesive layer 45 through heat conduction. The binder of the adhesive layer 45 includes a thermosetting resin, and when the adhesive layer 45 is heated to a predetermined temperature or higher, the thermosetting resin is polymerized to cure the adhesive layer 45.

Figure 3A:
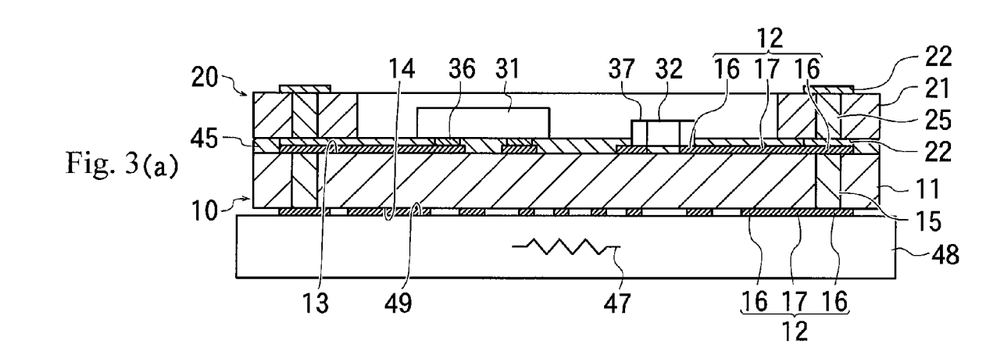
FIGS. 3(a) to 3(c) are sectional views illustrating steps of producing an electric component-mounted substrate.

FIG. 3(a) shows a state in which the pressing head 40 is moved away from the electric components 31 and 32 and the supporting substrate 20 after the adhesive layer 45 is cured.

The supporting substrate 20 and the electric components 31 and 32 are electrically connected and then fixed to the base substrate 10 with the adhesive layer 45, and thus the supporting substrate 20 and the electric components 31 and 32 are mechanically and electrically connected to the base substrate 10.

In this embodiment, the wiring film 12 of the first face 13 is positioned in the same plane, and the supporting substrate 20 is thicker than the electric components 31 and 32 as mentioned above. Therefore, the height of the leading edge of the supporting substrate 20 from the first face 13 is higher than the ends of the electric components 31 and 32 from the first face 13 in the state that the supporting substrate 20 and the electric components 31 and 32 are electrically and mechanically connected to the base substrate 10.

Figure 3B:
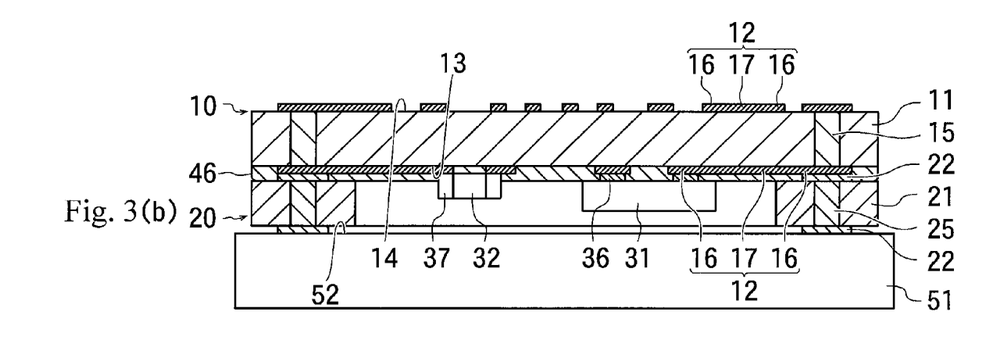

When the base substrate 10 to which the supporting substrate 20 and the electric components 31 and 32 are connected is placed on a flat processing face 52 of a processing table 51 with the supporting substrate 20 being on the downside, the supporting substrate 20 contacts the processing face 52, whereas the electric components 31 and 32 are suspended from the first face 13 to form gaps between the electric components 31 and 32 and the processing face 52 (FIG. 3(b)).

Figure 3C:
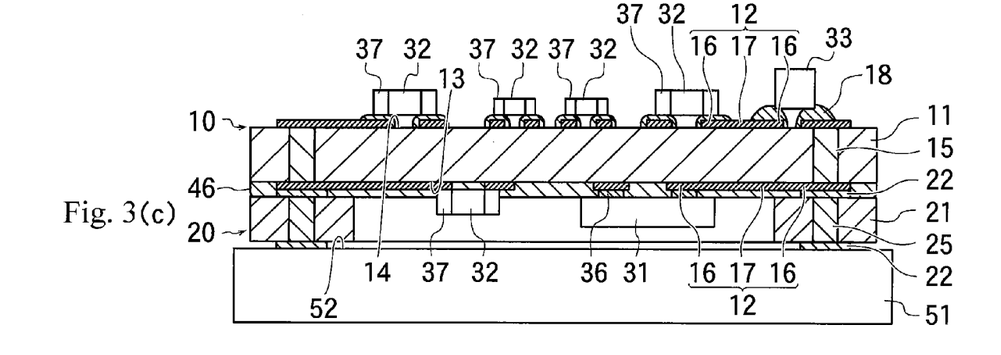

Low melting point metal layers 18 are formed by placing a solder paste on the connecting portions 16 of the second face 14 in the state that the second face 14 is almost horizontally disposed on the processing table 51, and then the electric components 32 and the odd-form component 33 are placed at determined positions on the second face 14. Thereby, the connecting terminals 37 of the electric components 32 are opposed to the connecting portions 16 via the low melting point metal layer 18, and the odd-form component 33 is also placed on connecting portions 16 (FIG. 3(c)).

When the base substrate 10, for example, is put into a reflow furnace together with the processing table 51 and the low melting point metal layers 18 are heated to the melting point or higher with the second face 14 being kept almost horizontally, the low melting point metal layer 18 is softened. This makes the connecting terminals 37 of the electric components 32 to be brought into contact with the connecting portions 16, and also the odd-form component 33 to be contacted with the connecting portion 16. Thus, the electric components 32 and the odd-form component 33 are electrically connected to the base substrate 10 (FIG. 4(a)).

When the low melting point metal layers 18 are heated, the cured adhesive layer 46 is also heated. However, the polymer of the thermosetting resin is not softened at least the melting point of the low melting point metal layer 18, and the adhesive layer 46 is kept cured. Accordingly, the electric components 31 and 32 on the side of the first face 13 are kept suspended without falling down.

Then, when the entire assembly is cooled to solidify the low melting point metal layer 18, the electric components 32 and the odd-form components 33 are fixed with the solidified low melting point metal layer 18, while being kept connected to the base substrate 10. Therefore, the electric components 32 and the odd-form component 33 are electrically and mechanically connected to the base substrate 10 with the solidified low melting point metal layer 18.

Thereafter, the electric component-mounted substrate 1 shown in FIG. 4(*b*) is obtained by disposing the solder balls 27 on the lands 22 on the side opposite to the base substrate 10.

The above examples are not limited to the case where the base substrate 10 and the supporting substrate 20 are rigid substrates (glass epoxy substrates), and flexible wiring boards can be used, too. When a flexible wiring board is used as the supporting substrate 20, the board which may not be deformed by compression when it supports the base substrate 10 is preferable.

When a flexible wiring board having flexibility is used as the base substrate 10, the base substrate 10 should be prevented from bending when the base substrate 10 is placed on the mounting table 48. Also, the supporting substrate 20 and the electric components 31 and 32 should be connected to the base substrate with the first face 13 being positioned in plane. Then, when the base substrate 10 to which the supporting substrate 20 and the electric components 31 and 32 are connected is moved onto the processing table 51, the base substrate 10 is not bent, so that the electric component 31, 32 does not contact the processing table 51.

The ring shape of the supporting substrate may be a rectangular shape, a circular shape or the like, not particularly limited. Any shape and any size of the ring may suffice so long as the supporting substrate 20 can be disposed on the base substrate 10 without falling down from the first face 13. For example, a part of the ring may protrude from the edge of the base substrate 10.

Further, the supporting substrate 20 is not limited to the ring-like shape. So long as the supporting substrate 20 can support the base substrate 10, one having an U-letter shape, a L-letter shape, a linear shape or a columnar shape can be used. However, when the supporting substrate 20 is in the ring-like shape, the positional misalignment of the electric components 31 and 32 can be prevented as mentioned above.

The electric components 31 and 32 are not limited to the case where they are disposed only inside the ring of the supporting substrate 20. It may be that electric components 31 and 32 arranged outside the ring of the supporting substrate 20 are connected to the base substrate 10 together with the supporting substrate 20 and the electric components 31 and 32 positioned inside the ring of the supporting substrate 20.

Figure 5:
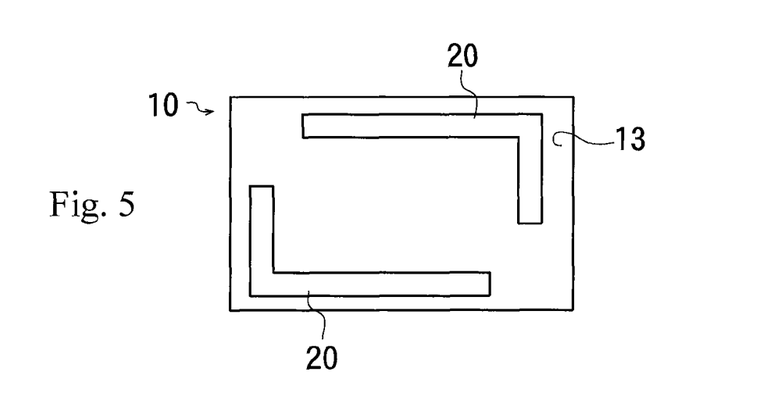
FIG. 5 is a plan view for illustrating a state in which L-letter shaped supporting substrates are connected to a base substrate.
Figure 6:
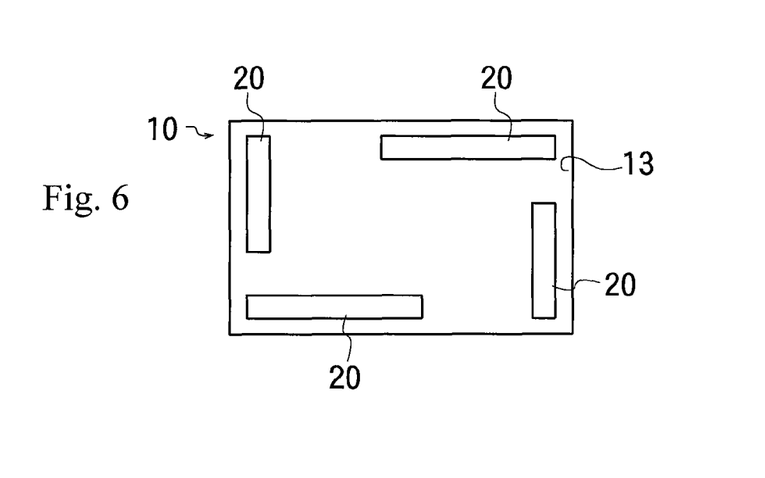
FIG. 6 is a plan view for illustrating a state in which linear or columnar supporting substrates are connected to a base substrate.

When the supporting substrate 20 has the L-letter shape, desirably two or more supporting substrates 20 are connected to the side of the first face 13 of the base substrate 10 as shown in FIG. 5 so as to stably support the base substrate 10. Meanwhile, when the supporting substrate 20 is linear or columnar, it is desirable that three or more supporting substrates 20 are connected to the side of the first face 13 of the base substrate 10 at intervals as shown in FIG. 6.

When the supporting substrates 20 are linear or columnar, and if fixing members are attached to the supporting substrates 20 for connection to the first face 13, the relative position among the supporting substrates 20 is fixed. Thereby, the base substrate 10 is not bent when it is supported by the supporting substrates 20, even if the base substrate 10 is a flexible wiring board having flexibility.

Although the case where the supporting substrate 20 is connected to the first face 13 only has been explained above, the embodiment is not limited thereto. The supporting substrates 20 can be connected to both the first and second faces 13 and 14. In this case, after the supporting substrate 20 is connected to the first face 13, the supporting substrate 20 is connected to the second face 14 in the state that the base substrate 10 is supported by that supporting substrate 20.

In the above, the case where the low melting point metal (solder) is used as the connecting material for connecting the electric components 31 and 32 to the second face 14 and the connection is performed by melting the low melting point metal has been explained. However, the embodiment is not limited thereto.

For example, in the case where the base substrate 10 is composed of a rigid substrate or the like which is not deformed even by pressing, the base substrate 10 is not bent when the electric component 32 or the odd-form component 33 is pressed in connecting the electric component 32 or the odd-form component 33 onto the second face 14. Consequently, the electric components 31 and 32 are kept suspended from the first face 13.

Therefore, a thermosetting adhesive, a thermoplastic adhesive or the like can be used, besides the low melting point metal, as the connecting material for connecting the electric components 32 and the odd-form component 33 to the second face 14.

When heating is performed to connect the electric components 32 and the odd-form component 33 to the second face 14, the heating temperature is set not to melt or break the connecting material for fixing the electric components 31 and 32 to the first face 13.

For example, when the electric components 31 and 32 are to be connected to the first face 13, it is possible to use a low melting point metal having a melting point higher than the heating temperature at which the electric components 32 and the odd-form component 33 are connected to the second face 14, or a thermoplastic adhesive having a softening temperature lower than the above heating temperature.

The thermosetting adhesive to be used in the present embodiment is an adhesive in which the electroconductive particles are dispersed in the binder including the thermosetting resin. The thermoplastic adhesive is an adhesive in which the electroconductive particles are dispersed in the binder including the thermoplastic resin. Further, when the thermoplastic resin is incorporated into the thermosetting adhesive, the adhesion property of the thermosetting adhesive is improved.

The method for disposing the connecting material on the first face 13 and second face 14 is not particularly limited, and it is possible to adopt various methods such as a mask printing method in which the connecting material is coated in the predetermined patterns by using a mask formed with the predetermined pattern openings, a dispenser method in which the connecting material is discharged by using a dispenser, and a method in which a film of the connecting material (adhesive film) is bonded, etc.

Furthermore, because the method for disposing the connecting material is not limited, the kind of the connecting material is not limited. Therefore, the connecting material can be selected to meet the characteristics of the electric components 31, 32 and 33 and the supporting substrate 20.

As the electric components 31 and 32 to be connected to the base substrate 10, a semiconductor tip, a resistance element, etc. are recited, for example. The kinds thereof are not particularly limited, either.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for producing a substrate including a plurality of electric components mounted thereon by connecting electric components respectively to a first face as one side of a base substrate and a second face as another side opposite to the first face, the method comprising:

disposing, on the first face of the base substrate, a plurality of first electric components and a supporting substrate thicker than the electric component;

pressing the supporting substrate and the plurality of first electric components together with a pressing rubber so as to electrically and mechanically connect the plurality of first electric components and the supporting substrate to the base substrate;

then placing a second electric component on the second face in a state that the base substrate is supported by the supporting substrate; and connecting the second electric component to the second face, wherein the plurality of first electric components includes a thicker electric component and a thinner electric component.

2. The method for producing the substrate including the plurality of electric components mounted thereon according to claim 1, wherein the plurality of first electric components and the supporting substrate are disposed such that the supporting substrate is located to make a through-hole of the base substrate to be electrically connected to a through-hole of the supporting substrate.

3. The method for producing the substrate including the plurality of electric components mounted thereon according to claim 1, wherein a planar shape of the supporting substrate is in the form of a ring, and the plurality of first electric components are disposed inside the ring.

* * * * *